(12) United States Patent
Chikagawa et al.

(10) Patent No.: US 8,720,050 B2
(45) Date of Patent: May 13, 2014

(54) METHOD FOR MANUFACTURING MULTILAYER SUBSTRATE WITH BUILT-IN CHIP-TYPE ELECTRONIC COMPONENT

(75) Inventors: Osamu Chikagawa, Yasu (JP); Norio Sakai, Moriyama (JP)

(73) Assignee: Murata Manufacturing Co., Ltd., Kyoto (JP)

(*) Notice: Subject to any disclaimer, the term of this patent is extended or adjusted under 35 U.S.C. 154(b) by 1043 days.

(21) Appl. No.: 12/774,072

(22) Filed: May 5, 2010

(65) Prior Publication Data
US 2010/0212152 A1 Aug. 26, 2010

Related U.S. Application Data

(62) Division of application No. 10/597,919, filed as application No. PCT/JP2005/019286 on Oct. 20, 2005, now Pat. No. 7,750,247.

(30) Foreign Application Priority Data

Oct. 29, 2004 (JP) ................................. 2004-317313

(51) Int. Cl.
*H05K 3/30* (2006.01)
(52) U.S. Cl.
USPC ................. 29/834; 29/832; 29/851; 174/260

(58) Field of Classification Search
USPC ........... 29/830–832, 834, 837, 842, 846, 851, 29/852; 156/89.17, 89.18; 174/255, 260, 174/262; 257/700, 703, 723; 361/321.2, 361/762
See application file for complete search history.

(56) References Cited

U.S. PATENT DOCUMENTS

| | | | | |
|---|---|---|---|---|
| 4,800,459 A | * | 1/1989 | Takagi et al. | 361/762 |
| 6,570,469 B2 | * | 5/2003 | Yamada et al. | 257/703 |
| 6,588,097 B2 | * | 7/2003 | Nishide et al. | 29/832 |

OTHER PUBLICATIONS

Chikagawa et al.; "Multilayer Substrate with Built-In Chip-Type Electronic Component and Method for Manufacturing the Same"; U.S. Appl. No. 10/597,919, filed Aug. 11, 2006.

* cited by examiner

*Primary Examiner* — Donghai D Nguyen
(74) *Attorney, Agent, or Firm* — Keating & Bennett, LLP

(57) ABSTRACT

A multilayer substrate having a built-in chip-type electronic component includes a ceramic laminate having a plurality of ceramic layers, a chip-type electronic component disposed in the ceramic laminate and having an external terminal electrode, and a via conductor disposed in the ceramic layers in the lamination direction. The external terminal electrode of the chip-type electronic component is connected to the via conductor, and a connection step is provided in at least one of the upper and lower end surfaces of the via conductor.

5 Claims, 6 Drawing Sheets

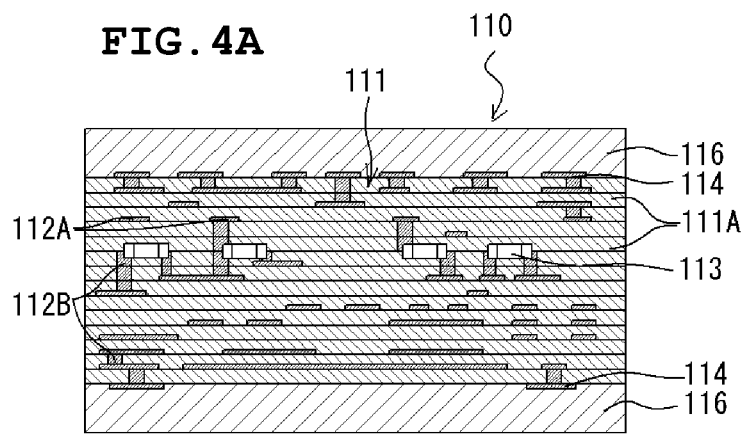
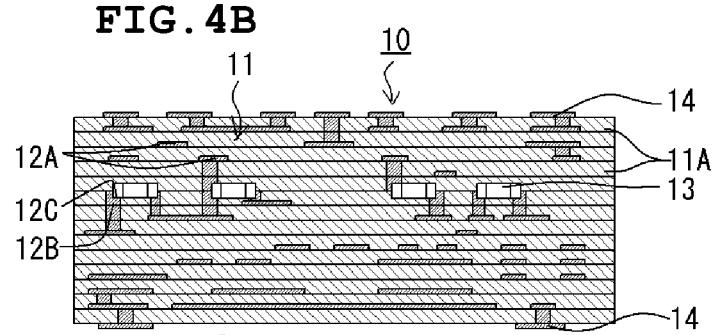
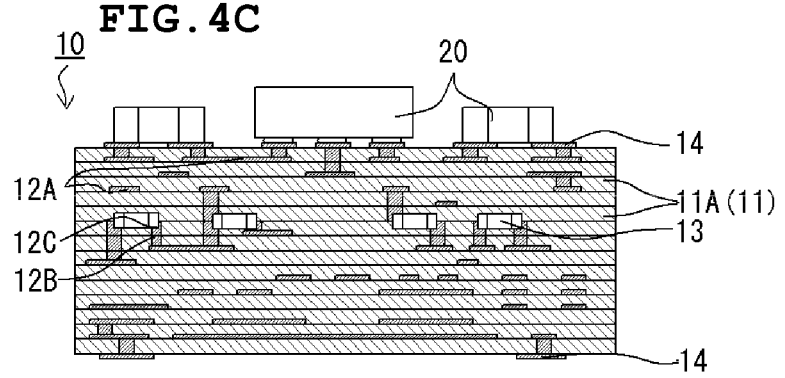

METHOD FOR MANUFACTURING MULTILAYER SUBSTRATE WITH BUILT-IN CHIP-TYPE ELECTRONIC COMPONENT

BACKGROUND OF THE INVENTION

1. Field of the Invention

The present invention relates to a multilayer substrate with a built-in chip-type electronic component and a method for manufacturing the same.

2. Description of the Related Art

Japanese Unexamined Patent Application Publication No. 2002-084067 discloses a conventional multilayer ceramic substrate and a method for manufacturing the same. In the multilayer ceramic substrate and the method for manufacturing the same disclosed in Japanese Unexamined Patent Application Publication No. 2002-084067, ceramic functional elements, such as a capacitor element, an inductor element, a resistor element, and other functional elements are previously formed using a sintered plate prepared by firing, and each of these functional elements is connected to an internal conductor film and via hole conductor in a green composite laminate. The green composite laminate includes a green substrate layer, a constraining layer including a material which does not sinter at the sintering temperature of the green substrate layer, and a wiring conductor. When the green composite laminate is fired, shrinkage of the green substrate layer in the direction of a main surface is suppressed by the constraining layer. In this technique, firing is performed by a nonshrinkage step using the constraining layer, and thus, the green composite laminate with the built-in functional elements can be fired with no problem while maintaining the characteristics of the functional elements after firing because of no mutual diffusion of the constituents between the functional elements composed of the sintered plate and the green substrate layer.

In the multilayer ceramic substrate disclosed in Japanese Unexamined Patent Application Publication No. 2002-084067, in order to provide the sintered plate in the ceramic multilayer substrate, the sintered plate is bonded to a conductor pattern of an internal conductor film, which is formed on a ceramic green sheet using conductive paste, and then another ceramic green sheet is laminated, followed by pressure-bonding to form a ceramic green laminate.

In the conventional technique disclosed in Japanese Unexamined Patent Application Publication No. 2002-084067, when a positional shift occurs due to poor alignment between the sintered plate and the internal conductor film, thereby causing a slight connection between the sintered plate and the internal conductor film, a defect is likely to occur in a connection to the sintered plate.

On the other hand, when a surface-mounted component is mounted on a surface electrode on a substrate by soldering, self-alignment of the surface-mounted component is caused during reflow, and thus, the above-described problem does not occur. However, when the built-in sintered plate is provided, a self-alignment function is not performed, and thus, a positional shift due to poor alignment of the sintered plate cannot be corrected because the mounting precision is directly reflected. Therefore, when forming the built-in sintered plate, connection reliability cannot be obtained unless a connection part (electrode pad) between the internal conductor film and the sintered plate is larger than a surface electrode on the substrate. In addition, the wiring density is decreased by providing a larger electrode pad on the internal conductor film, thereby failing to decrease the size of the ceramic multilayer substrate.

SUMMARY OF THE INVENTION

To overcome the problems described above, preferred embodiments of the present invention provide a multilayer substrate having a built-in chip-type electronic component, which significantly improves the connection reliability between the built-in chip-type electronic component and an internal conductor, and a method for manufacturing the same.

A multilayer substrate with a built-in chip-type electronic component according to a preferred embodiment of the present invention includes a laminate including a plurality of dielectric layers, a chip-type electronic component disposed in the laminate and having a terminal electrode, and a via conductor provided in the dielectric layers in the lamination direction, wherein the terminal electrode of the chip-type electronic component is connected to at least one of the upper and lower end surfaces of the via conductor, and a connection step is provided in the via conductor.

The dielectric layers are preferably ceramic layers, such that the laminate is a ceramic laminate including a plurality of the ceramic layers, and the chip-type electronic component includes a ceramic sintered body defining an element body.

The ceramic layers are preferably made of a low-temperature co-fired ceramic material, and the via conductor is preferably made of a conductor material including silver or copper as a main component.

A method for manufacturing a multilayer substrate with a built-in chip-type electronic component according to another preferred embodiment of the present invention includes the steps of disposing a chip-type electronic component having a terminal electrode on a dielectric layer having a via conductor such that the terminal electrode comes in contact with the via conductor, and laminating the dielectric layer having the chip-type electronic component disposed thereon and another dielectric layer to form a laminate having the built-in chip-type electronic component.

Each of the dielectric layers preferably includes a ceramic green body, the chip-type electronic component includes a ceramic sintered body defining an element body, and the ceramic green body having the chip-type electronic component disposed thereon and the other ceramic green body are laminated to form a ceramic green laminate having the built-in chip-type electronic component, followed by firing of the ceramic green laminate.

The other ceramic green body preferably has a via conductor to be connected to the terminal electrode of the chip-type electronic component.

The method for manufacturing the multilayer substrate with the built-in chip-type electronic component according to this preferred embodiment preferably further includes the steps of forming the ceramic green bodies using a low-temperature co-fired ceramic material, and forming a conductor pattern composed of silver or copper as a main constituent in the ceramic green laminate.

The method for manufacturing the multilayer substrate with the built-in chip-type electronic component preferably further includes the step of adding a shrinkage suppression layer made of a powder that is not sinterable at the sintering temperature of the ceramic green bodies, such that the shrinkage suppression layer is not substantially sintered at the sintering temperature of the ceramic green bodies, in the ceramic green laminate or on a surface thereof.

Preferred embodiments of the present invention provide a multilayer substrate with a built-in chip-type electronic component and a method for manufacturing the same, which are capable of significantly improving the connection reliability between the built-in chip-type electronic component and an internal conductor.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 1A to 1C are views showing a ceramic multilayer substrate with a built-in chip-type electronic component according to a preferred embodiment of the present invention, in which FIG. 1A is a sectional view showing the whole, FIG. 1B is an enlarged sectional view showing a principal portion, and FIG. 1C is a plan view of the principal portion shown in FIG. 1B.

FIGS. 3A to 3C are views each showing a principal portion in a step for manufacturing the ceramic multilayer substrate shown in FIGS. 1A to 1C, in which FIG. 3A is a sectional view showing a ceramic green sheet, FIG. 3B is a sectional view showing a state in which chip-type electronic components are mounted on the ceramic green sheet shown in FIG. 3A, and FIG. 3C is a sectional view showing a state in which the ceramic green sheet shown in FIG. 3B and other ceramic green sheets are laminated.

FIG. 4A to 4C are views each showing a step after the manufacturing steps shown in FIGS. 2A and 2B, in which FIG. 4A is a sectional view showing a press-bonded body before firing, FIG. 4B is a sectional view showing the ceramic multilayer substrate after firing, and FIG. 4C is a sectional view showing a state in which chip-type electronic components are mounted on the ceramic multilayer substrate shown in FIG. 4B.

FIGS. 5A and 5B are sectional views each illustrating a shift of the mounting position of a chip-type electronic component of the ceramic multilayer substrate shown in FIGS. 1A to 1C, in which FIG. 5A is a sectional view illustrating a state in which no positional shift occurs, and FIG. 5B is a sectional view illustrating a state in which a positional shift occurs.

DETAILED DESCRIPTION OF PREFERRED EMBODIMENTS

The present invention will be described on the basis of preferred embodiments shown in FIGS. 1A to 6.

Figure 1A:
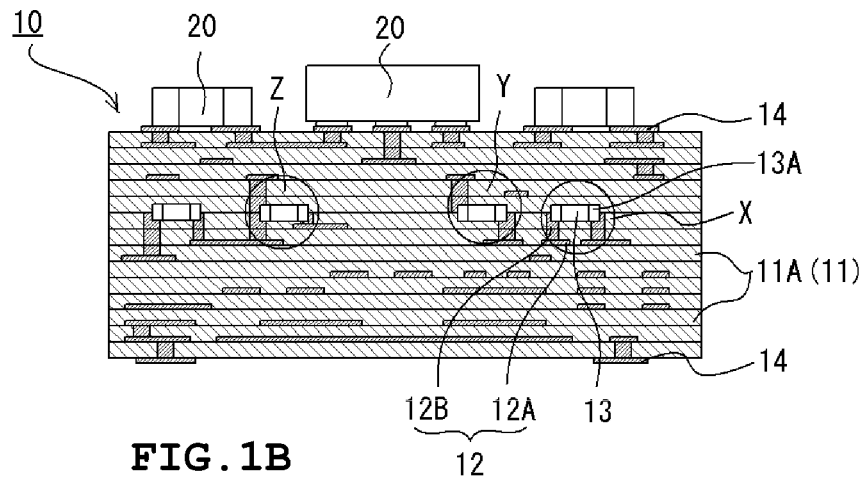

For example, as shown in FIG. 1A, a multilayer substrate 10 having a built-in chip-type electronic component according to a preferred embodiment is a ceramic multilayer substrate including a ceramic laminate in which a plurality of ceramic layers 11A is laminated and internal conductor patterns 12 are disposed, and a plurality of chip-type electronic components 13 disposed at an interface between the upper and lower ceramic layers 11A. Each of the chip-type electronic components 13 includes a ceramic sintered body as an element body and external terminal electrodes 13A disposed at both ends thereof. In addition, surface electrodes 14 are disposed on both main surfaces (upper and lower surfaces) of the ceramic laminate 11. Therefore, in the description below, the multilayer substrate 10 with the built-in chip-type electronic component is referred to as the "ceramic multilayer substrate 10."

As shown in FIG. 1A, a plurality of surface-mounted components 20 is mounted on the upper surface of the ceramic laminate 11 through the surface electrodes 14. As the surface-mounted components 20, active elements, such as a semiconductor element, a gallium arsenic semiconductor element, and other suitable active elements, passive elements, such as a capacitor, an inductor, a resistor, and other suitable passive elements are electrically connected to the surface electrodes 14 on the upper surface of the ceramic laminate 11 using solder, a conductive resin, or a bonding wire of Au, Al, Cu, or other suitable material. The chip-type electronic components 13 are electrically connected to the surface-mounted components 20 through the surface electrodes 14 and the internal conductor patterns 12. The ceramic multilayer substrate 10 can be mounted on a mount substrate, such as a mother board, through the surface electrodes 14 formed on the lower surface.

The material of the ceramic layers 11A of the ceramic laminate 11 is not particularly limited as long as it is a ceramic material. In particular, a low temperature co-fired ceramic (LTCC) material is preferred. The low temperature co-fired ceramic material is a ceramic material which can be sintered at a temperature of about 1,050° C. or less and co-sintered with silver or copper having low resistivity. Examples of the low temperature co-fired ceramic material include glass composite LTCC materials each including a mixture of a ceramic powder of alumina or forsterite and borosilicate glass; crystallized glass LTCC materials each including ZnO-MaO—$Al_2O_3$—$SiO_2$ crystallized glass; and non-glass LTCC materials each including a BaO—$Al_2O_3$—SiO ceramic powder or $Al_2O_3$—CaO—$SiO_2$—MgO—$B_2O_3$ ceramic powder.

By using the low temperature co-fired ceramic material as the material for the ceramic laminate 11, a metal having low resistance and low melting point, such as Ag or Cu, can be used for the internal conductor patterns 12 and the surface electrodes 14, and thus, the ceramic laminate 11 and the internal conductor patterns 12 can be co-fired at a low temperature of about 1,050° C. or less.

As the ceramic material, a high temperature co-fired ceramic material (HTCC) material may be used. An example of a suitable high temperature co-fired ceramic material is prepared by sintering a mixture of alumina, aluminum nitride, mullite, or other suitable material and a sintering aid, such as glass, at about 1,100° C. or more. In this case, a metal selected from molybdenum, platinum, palladium, tungsten, nickel, and alloys thereof, may be used for the internal conductor patterns 12 and the surface electrodes 14.

As shown in FIG. 1A, the ceramic laminate 11 has the internal conductor patterns 12 formed therein and the surface electrodes 14 formed on the upper and lower surfaces. Each of the internal conductor patterns 12 includes a planar conductor 12A arranged in a predetermined pattern along an interface between the upper and lower ceramic layers 11A, and a via conductor 12B having, for example, a substantially cylindrical shape, so as to pass in a predetermined pattern through the corresponding ceramic layer 11A in the lamination direction thereof such that the upper and lower planar conductors 12A are connected to each other.

Figure 1B:
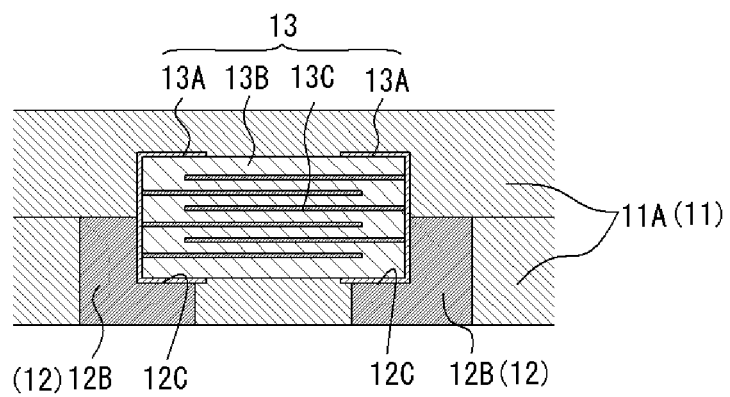

As shown in FIGS. 1A and 1B, the chip-type electronic components 13 are disposed on one of the interfaces between the upper and lower ceramic layers 11A, and each of the external terminal electrodes 13A is connected directly to at least one of the upper and lower end surfaces of the via conductors 12B. The chip-type electronic components 13 are connected to the via conductors 12B through a plurality of connection patterns. Particularly, in this preferred embodiment, the chip-type electronic components 13 are connected to the via conductors 12B through three connection patterns X, Y, and Z as shown by circles in FIG. 1A.

Figure 1C:
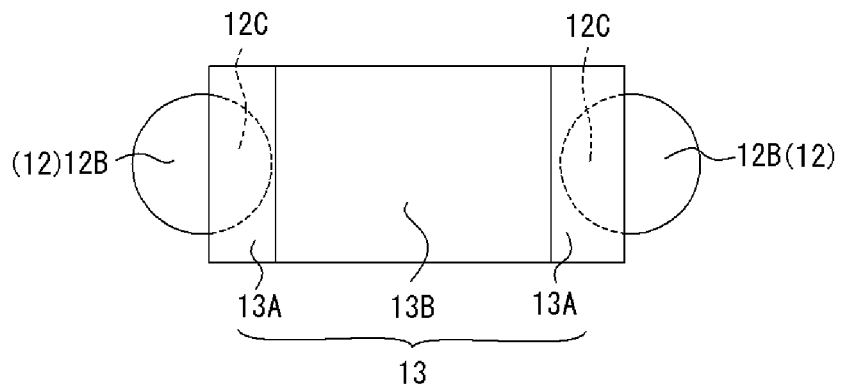

First, the connection pattern X will be described with reference to FIGS. 1B and 1C. As shown in FIGS. 1A to 1C, a pair of the right and left external terminal electrodes 13A of the corresponding chip-type electronic component 13 is connected to a pair of the right and left via conductors 12B formed in the ceramic layer 11A in contact with the lower surface of the chip-type electronic component 13. Furthermore, opposing steps (referred to as "connection steps" hereinafter) 12C are formed in the respective upper end surfaces of the pair of via conductors 12B such that the external terminal electrodes 13A are connected to the respective connection steps 12C. Each of the connection steps 12C is formed by cutting out approximately half of the upper end surface of the via conductor 12B and has a L-shaped sectional form. Therefore, a lower half of each external terminal electrode 13A of the chip-type electronic component 13 is connected to the via conductor 12B through the two surfaces including the vertical surface and the bottom surface of each of the opposing connection steps 12C. In other words, the substantially rectangular chip-type electronic component 13 is connected to the corresponding via conductors 12B through at least two surfaces, i.e., the end surface and the bottom surface. In FIG. 1B, a monolithic ceramic capacitor is shown as a chip-type electronic component 13 including ceramic sintered body 13B used as an element body and internal electrodes 13C.

In the connection pattern Y, one (the right in FIG. 1A) of the corresponding external terminal electrodes 13A of the chip-type electronic component 13 is connected to the connection step 12C of the via conductor 12B formed in the lower ceramic layer 11A, and the other external terminal electrode 13A (the left in FIG. 1A) is connected to the connection step 12C of the via conductor 12B formed in the upper ceramic layer 11A. In this case, the right via conductor 12B preferably has substantially the same shape as that of the right via conductor 12B shown in FIG. 1B. The left via conductor 12B includes the connection step 12C formed at the lower end thereof. The connection steps 12C of the right and left via conductors 12B have opposing planes of connection to the respective external terminal electrodes 13A, and also have a positional relation in which the rotation angle between the steps around the chip-type electronic component 13 is about 180°. In this connection pattern, the via conductors 12B connected to the respective external terminal electrodes 13A are separated, and thus, the pitch between the via conductors 12B is narrowed, thereby enabling a reduction in the size of the chip-type electronic components 13 and sufficiently ensuring isolation between the respective via conductors 12B.

In the connection pattern Z, one (the right in FIG. 1A) of the external terminal electrodes 13A of the corresponding chip-type electronic component 13 is connected to the connection step 12C of the via conductor 12B formed in the lower ceramic layer 11A, and the other external terminal electrode 13A (the left in FIG. 1A) is connected to the upper and lower connection steps 12C of the via conductors 12B which are continuously formed in the upper and lower ceramic layers 11A, respectively, such that the external terminal electrode 13A is disposed between the upper and lower connection steps 12C. In this case, the right via conductor 12B has the same shape as that of the right via conductor 12B in the connection pattern X. Among the left via conductors 12B, the lower via conductor 12B has the same shape as that of the left via conductor 12B in the connection pattern X, and the upper via conductor 12C has the same shape as that of the lift via conductor 12C in the connection pattern Y. In this connection pattern, the reliability of connection between the external terminal electrodes 13A and the via conductors 12B is further improved.

Figure 2A:
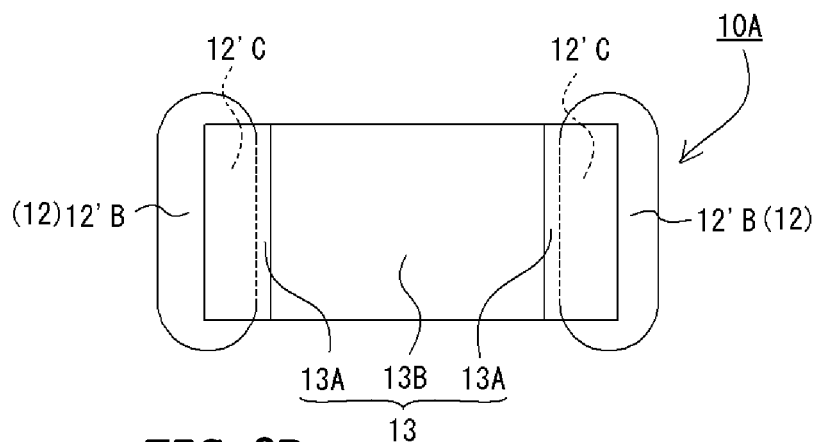
FIGS. 2A and 2B are plane views each showing a principal portion of a multilayer substrate with a built-in chip-type electronic component according to another preferred embodiment of the present invention, the plane views corresponding to FIG. 1C.
Figure 2B:
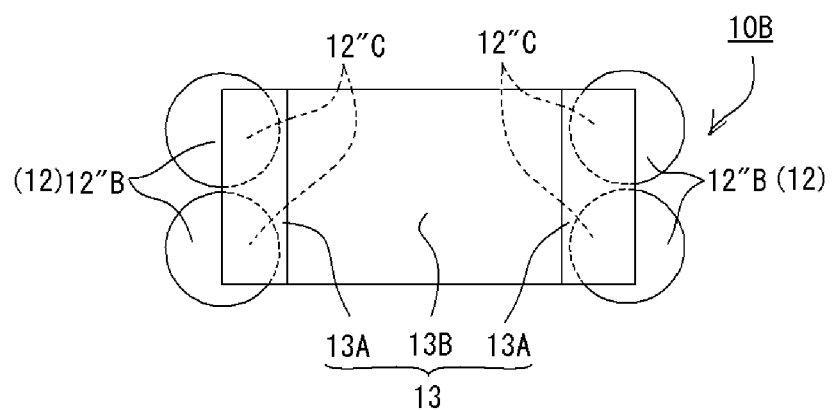

The via conductors 12B to which each chip-type electronic component 13 is connected are not limited to those shown in FIGS. 1A to 1C, and, for example, the via conductors shown in FIGS. 2A and 2B may be used.

The via conductors 12'B shown in FIG. 2A are configured to have an elliptic planar shape in which the long axis is slightly longer than the width of the chip-type electronic component 13. The external terminal electrodes 13A of the chip-type electronic component 13 are arranged such that the end surfaces coincide with the long axes of the respective via conductors 12'B, and are closely connected to the connection steps 12'C formed in the upper surfaces of the respective via conductors 12'B. As shown in FIG. 2A, each of the connection steps 12'C has three vertical wall surfaces and a bottom surface corresponding to the end surface, both side surfaces and the bottom surface of the corresponding external terminal electrode 13A are arranged such that each connection step 12'C is connected to the corresponding external terminal electrode 13A through the four surfaces. Similar to FIGS. 1A and 1B, the three vertical wall surfaces are connected to a lower half of each external terminal electrode 13A. Therefore, the area of contact of each via conductor 12'B with the corresponding external terminal electrode 13A is greater than that shown in FIGS. 1A and 1B, thereby further improving connection reliability.

The via conductors 12"B shown in FIG. 2B have substantially the same circular shape as that of the via conductors shown in FIGS. 1A and 1B, but the outer diameter thereof is slightly less than that shown in FIGS. 1A and 1B. One of the external terminal electrodes 13A of the chip-type electronic component 13 is connected to connection steps 12"C formed in two via conductors 12"B arranged with a space therebetween. The two via conductors 12"B are arranged such that a line passing through the centers thereof substantially coincides with the end surface of each external terminal electrode 13A of the chip-type electronic component 13, and the two via conductors 12"B are symmetric with respect to the axis of the chip-type electronic component 13. As shown in FIG. 2B, the connection step 12"C of one of the two via conductors 12"B has two vertical wall surfaces and a bottom surface corresponding to the end surface, one of the side surfaces, and the bottom surface of each external terminal electrode 13A are arranged such that the connection step 12"C is connected to a half of the end of each external terminal electrode 13A through the three surfaces. Similarly, the other via conductor 12"B is connected to the remaining half of the end of each external terminal electrode 13A through the three surfaces. Therefore, the via conductors 12"B are connected to each external terminal electrode 13A in a contact area which is between the case shown in FIGS. 1A and 1B and the case shown in FIG. 2A, thereby improving connection reliability.

Examples of the chip-type electronic components 13 include, but are not particularly limited to, components including, as an element body, a ceramic sintered body formed by firing barium titanate, ferrite, or other suitable material at about 1,200° C. or more. Specific examples of such components include chip-type electronic components, such as an inductor, a filter, a balun, a coupler, in addition to the monolithic ceramic capacitor shown in FIG. 1B. These chip-type electronic components may be used alone or in a combination of two or more appropriately selected components. In the case shown in FIG. 1A, a plurality of the chip-type electronic components 13 is disposed on the same ceramic layer 11A. However, the chip-type electronic components 13 may be disposed at any desired interface between the upper and lower ceramic layers 11A. Alternatively, a plurality of the chip-type electronic components 13 may be laminated over a plurality of different interfaces in the vertical direction. The plurality of chip-type electronic components 13 may be connected in series and/or parallel through the connection steps 12C of the via conductors 12B to increase the functionality and performance of the ceramic multilayer substrate 10 according to its desired purposes.

Next, a method for manufacturing the ceramic multilayer substrate 10 will be described with reference to FIGS. 3A to 5B.

In this preferred embodiment, manufacture of the ceramic multilayer substrate 10 preferably using a nonshrinkage method is described. The term "nonshrinkage method" means a method in which when a ceramic material is used for the ceramic laminate 11, the ceramic laminate causes substantially no dimensional change in the planar direction during firing.

Figure 3A:
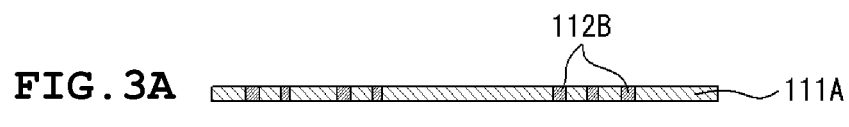
Figure 3B:
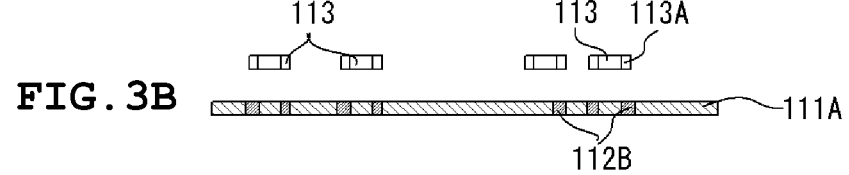

In this preferred embodiment, first, a plurality of ceramic green sheets is prepared using slurry including, for example, a low temperature co-fired ceramic material. Also, as shown in FIGS. 3A and 3B, via holes are formed in a predetermined pattern in a ceramic green sheet 111A, for mounting chip-type electronic components 113 each including a ceramic sintered body used as an element body. These via holes are preferably formed as substantially circular through holes each having a diameter slightly less than the width of the chip-type electronic components 113 and greater than the diameter of via conductors formed in other ceramic green sheets. The via holes are filled with conductive paste including, for example, Ag or Cu, as a main component, to form via conductors 112B. Furthermore, the same conductive paste is applied in a predetermined pattern on another ceramic green sheet 111A by screen printing to form surface electrodes 114 (refer to FIG. 3C). In the ceramic green sheet 111A, the surface electrodes 114 are appropriately connected to the via conductors 112B. Other ceramic green sheets 111A each having in-plane conductors 112A and/or the via conductors 112B are prepared in the same manner as described above. The via holes may be formed as through holes for forming the via conductors 12B shown in FIG. 2A or 2B.

In description below, the chip-type electronic components during firing are denoted by reference numeral 113, and the chip-type electronic components after firing and subsequent temperature drop are denoted by reference numeral 13.

Next, an organic adhesive is applied or sprayed, using a spray or other suitable adhesive, on the in-plane conductors 112A on the upper surface of the ceramic green sheet 111A on which the chip-type electronic components 113 are to be disposed, to form organic adhesive layers (not shown). As shown in FIG. 3B, the external terminal electrodes 113A of each chip-type electronic component 113 are aligned with the respective via conductors 112B of the ceramic green sheet 111A, and the chip-type electronic components 113 are mounted on the ceramic green sheet 111A. Then, the external terminal electrodes 113A of the chip-type electronic components 113 are bonded and fixed to the respective via conductors 112B through the organic adhesive layers. As the organic adhesive, a mixture including synthetic rubber or a synthetic resin and a plasticizer may be used. The thickness of the organic adhesive layers is preferably about 3 μm or less when applied and about 1 μm or less in when sprayed, for example.

Figure 3C:
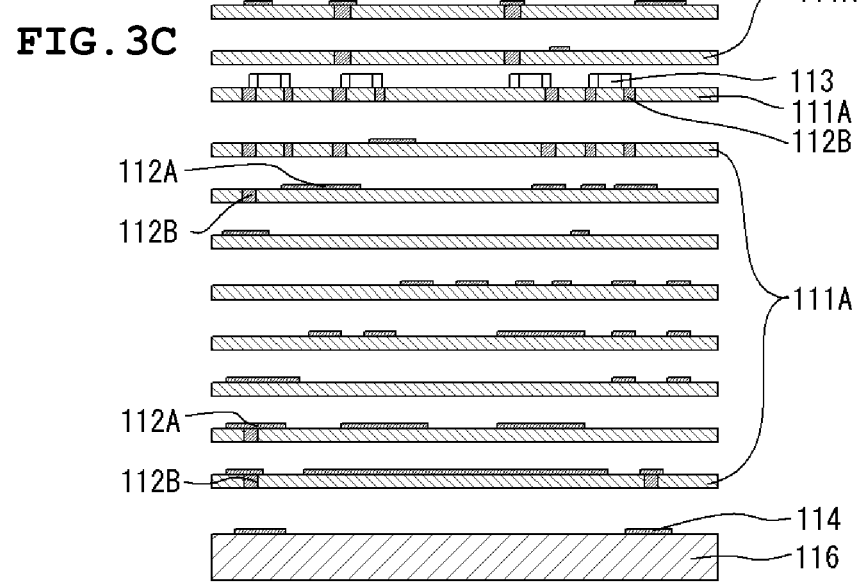

Then, as shown in FIG. 3C, the ceramic green sheets 111A each having the in-plane conductors 112A and/or the via conductor 112B and the ceramic green sheet 111A having the chip-type electronic components 113 mounted thereon are laminated in a predetermined order on a constraining layer 116. Also, the uppermost ceramic green sheet 111A having the surface electrodes 114 is laminated to form a ceramic green laminate 111 on the constraining layer 116. Furthermore, another constraining layer 116 is laminated on the upper surface of the ceramic green laminate 111, and the ceramic green laminate 111 is subjected to heat-bonding under pressure at a predetermined temperature and pressure through the upper and lower constraining layers 116 to obtain a pressure-bonded body 110 shown in FIG. 4A. As the constraining layers 116, a sheet is formed as shown in FIG. 4A using a paste including a powder (for example, a ceramic powder having a high sintering temperature, such as $Al_2O_3$ or other suitable powder) which is not sintered at the sintering temperature of the ceramic green laminate 111, e.g., $Al_2O_3$, as a main component and an organic binder as a secondary component.

Figure 5A:
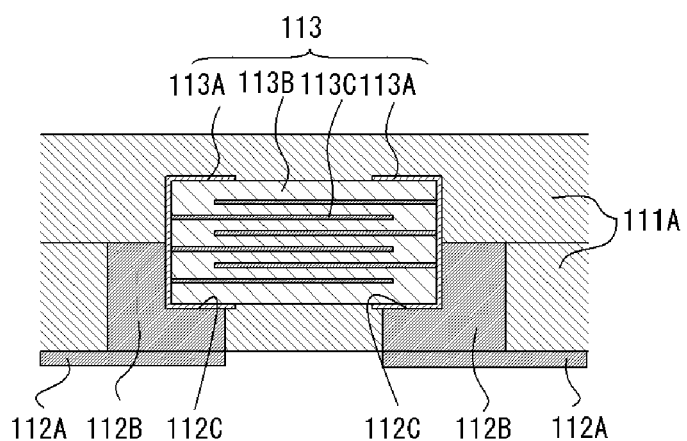

When each of the chip-type electronic components 113 is correctly disposed at a predetermined location of the via conductor 112B of the corresponding ceramic green sheet 111A, as shown in FIG. 5A, each chip-type electronic component 113 is buried in the ceramic green sheet 111A by a pressure bonding operation and connected to the right and left via conductors 112B through the right and left external terminal electrodes 113A, respectively, while forming the connection steps 112C by uniform compressive deformation of inner halves of the respective upper surfaces of the light and left via conductors 112b. Therefore, the right and left external terminal electrodes 113A are connected to the respective connection steps 112C through two surfaces each.

Figure 5B:
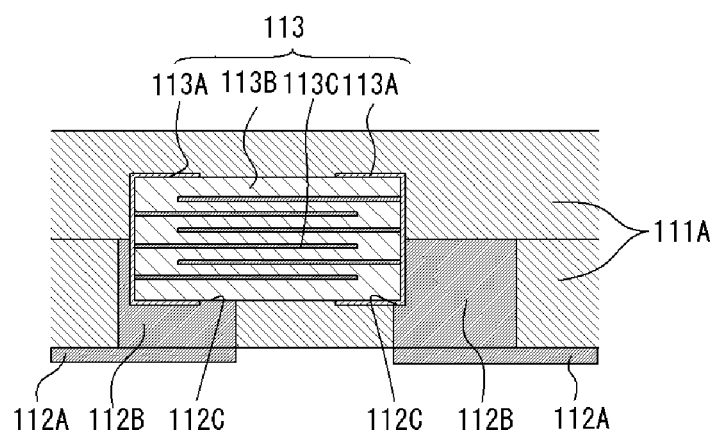

For example, when the chip-type electronic component 113 is shifted to the left from a predetermined position, as shown in FIG. 5B, the chip-type electronic component 113 is connected to the right and left via conductors 112B while forming the connection steps 112C by compressive deformation of the via conductors 112B such that the left external terminal electrode 113A comes in contact with the left via conductor 112B in a larger contact area, and the right external terminal electrode 113A comes in contact with a portion of the right via conductor 112B in a small contact area. More specifically, even when one of the external terminal electrodes 113A comes in contact with a portion of the corresponding via conductor 112B, the via conductors 112B are deformed without being cut by compressive deformation while maintaining contact with the external terminal electrodes 113A. Therefore, as shown in FIG. 5B, the external terminal electrodes 113A are securely connected to the respective via conductors 112B.

After the pressure-bonded body 110 with the built-in chip-type electronic components 113 is formed as described above, the pressure-bonded body 110 shown in FIG. 4A is fired, for example, at about 870° C. in an air atmosphere to obtain the ceramic multilayer substrate 10 shown in FIG. 4B. The external terminal electrodes 113A of each of the built-in chip-type electronic components 113 are connected to the respective via conductors 112B by integration due to grain growth of the metal grains of these parts during sintering. The firing temperature is preferably the sintering temperature of a low temperature co-fired material, for example, in a range of about 800° C. to about 1,050° C. At a firing temperature lower than about 800° C., the ceramic constituents of the ceramic green laminate 111 may not be sufficiently sintered, while at a temperature over about 1,050° C., the metal grains of the internal conductor patterns 12 may be melted and diffused into the ceramic green laminate 111.

After firing, the upper and lower constraining layers 116 are removed by blasting or ultrasonic washing to prepare the ceramic multilayer substrate 10. Furthermore, as shown in FIG. 4C, predetermined surface-mounted components 20 are mounted on the surface electrodes 14 of the ceramic multilayer substrate 10 by soldering or other suitable method to obtain a final product. The external terminal electrodes 113A of the chip-type electronic components 113 may be in the form of a paste coating after baking or a dried paste coating before baking.

Furthermore, the surface-mounted components 20 are used in appropriate combination with the chip-type electronic components 13, as shown in FIG. 1A. The chip-type electronic components 13 are connected to the surface-mounted components 20 through the surface electrodes 14 and the internal conductor patterns 12. When the surface-mounted components 20 are components susceptible to power noise, such as integrated circuits, a monolithic ceramic capacitor may be connected as the chip-type electronic component 13 near a portion immediately below a power terminal and ground terminal of each surface-mounted component 20. In this case, the terminal arrangement of the surface-mounted components 20, such as integrated circuits or other suitable components is not limited, and chip-type electronic components (e.g., monolithic ceramic capacitors) need not be separately mounted on a mother board. Therefore, a power supply voltage is stably supplied and output oscillation is prevented, thereby removing noise with a high efficiency.

As described above, in this preferred embodiment, the chip-type electronic components 113, each including a ceramic sintered body used as an element body and terminal electrodes, are disposed on the ceramic green sheet 111A including the via conductors 112B such that the external terminal electrodes 113A of each chip-type electronic component 113 come into contact with the respective via conductors 112B. Then, the other ceramic green sheets 111A and the ceramic green sheet 111A having the chip-type electronic components 113 disposed thereon are laminated to form the ceramic green laminate 111 including the built-in chip-type electronic components 113. Thereafter, the ceramic green laminate 111 is fired to prepare the ceramic multilayer substrate 10. Therefore, in the resultant ceramic multilayer substrate 10, the external terminal electrodes 13A of each chip-type electronic component 13 are connected to the respective via conductors 12B, and the connection steps 12C are formed at the end surfaces of the respective via conductors 12B. Since, in the ceramic multilayer substrate 10, the external terminal electrodes 13A of each chip-type electronic component 13 are connected to the connection steps 12C formed at the end surfaces of the respective via conductors 12, the respective via conductors 12B are securely connected to the external terminal electrodes 13A without disconnection, thereby significantly improving the connection reliability.

In this preferred embodiment, the via conductors 12B come in contact with the upper surfaces and/or lower surfaces of the right and left external terminal electrodes 13A of each chip-type electronic component 13. Therefore, the chip-type electronic components 13 can be connected to the via conductors 12B through various connection patterns, thereby increasing the degree of freedom of the internal conductor patterns 12. Furthermore, in this preferred embodiment, the ceramic layers 11A are low-temperature sintered ceramic layers, and thus, a low-resistance inexpensive metal, such as Ag or Cu, can be used for the internal conductor patterns 12 and the surface electrodes 14. This reduces the manufacturing costs.

This preferred embodiment is described with respect to a ceramic multilayer substrate including a ceramic laminate in which dielectric layers used as ceramic layers are laminated, and chip-type ceramic electronic components each including a ceramic sintered body as an element body are provided. However, a resin multilayer substrate may be used, in which chip-type electronic components, each including a ceramic sintered body or a resin as an element body, are provided in a resin laminate of resin layers defining dielectric layers.

Although, in this preferred embodiment, a description is provided in which the constraining layers 116 are disposed on both the upper and lower surfaces of the ceramic green laminate 111 to prepare the ceramic multilayer substrate 10. However, the constraining layers (shrinkage suppression layer) may be appropriately interposed between the ceramic green sheets in the ceramic green laminate. In this case, the shrinkage suppression layers remain in the ceramic multilayer substrate. However, the glass constituents of the ceramic green sheets are diffused into the shrinkage suppression layers during sintering of the ceramic green sheets, and thus, the green ceramic material of the shrinkage suppression layers is bonded and consolidated by the glass constituents to transform the shrinkage suppression layers to ceramic layers.

Example 1

In this example, a ceramic multilayer substrate was formed by nonshrinkage firing, and disconnection between a chip-type electronic component (monolithic ceramic capacitor) and via conductors was examined.

Preparation of Ceramic Multilayer Substrate

In order to form a ceramic multilayer substrate, a slurry was prepared using $Al_2O_3$ as a filler, and a low temperature co-fired ceramic material as a ceramic material, which included borosilicate glass as a sintering aid. The slurry was applied on a plurality of carrier films to prepare a plurality of ceramic green sheets. Then, via holes of approximately 0.3 mm in diameter were formed in one of the ceramic green sheets by layer processing, and the ceramic green sheet was brought into close contact with a smooth support base. In this state, a conductive paste including an Ag powder as a main component was inserted into the via holes using a metal mask to form via conductors. Also, in-plane conductors were formed in a predetermined pattern on the ceramic green sheet by screen printing of the same conductive paste. Similarly, the via conductors and in-plane conductors were formed on the other ceramic green sheets.

Next, a monolithic ceramic capacitor was prepared as a chip-type electronic component including a sintered ceramic body as an element body. The monolithic ceramic capacitor included the sintered ceramic body (approximate size: 0.6 mm×0.3 mm×0.3 mm, internal electrode: Pd, capacity specification: 80 pF) prepared by firing at about 1,300° C. The monolithic ceramic capacitor also had external terminal electrodes which were formed on both ends by applying conductive paste including Ag as a main component and then baking the paste. The external terminal electrodes were not subjected to plating. The width of the monolithic ceramic capacitor was the same as the diameter of the via conductors. Then, an organic adhesive was applied on a predetermined ceramic green sheet using, for example, a spray to form organic adhesive layers on the in-plane conductors. Thereafter, the monolithic ceramic capacitor was mounted on the ceramic green sheet using a mounter aligned with the predetermined in-plane conductors and then bonded and fixed.

In this preferred embodiment, ten ceramic green sheets measuring approximately 200 mm×200 mm square and about 50 μm in thickness after firing were laminated, and a plurality of monolithic ceramic capacitors was provided so as to be located about 100 μm lower than a surface of the substrate after firing. As a result, a ceramic green laminate was produced.

Furthermore, sheets defining constraining layers were laminated on both surfaces of the ceramic green laminate measuring approximately 200 mm×200 mm square, and then the laminate was subjected to preliminary pressure bonding, for example, at about 10 MPa. After the preliminary pressure bonding, the laminate was subjected to primary pressure bonding, for example, at about 100 MPa. In the primary pressure bonding, connection steps for connection were formed in the respective via conductors by the monolithic ceramic capacitors in the ceramic green laminate. After the primary pressure bonding, the pressure-bonded body was fired at about 870° C. in an air atmosphere, and then the green constraining layers were removed to obtain the ceramic multilayer substrate that has a thickness of about 0.5 mm.

In Comparative Example 1, a ceramic multilayer substrate was prepared in the same manner as in Example 1, except that an electrode pad having a diameter of about 0.3 mm was formed on an in-plane conductor defining a connection part for each monolithic ceramic capacitor.

Evaluation of Ceramic Multilayer Substrate

Each of the ceramic multilayer substrates of Example 1 and Comparative Example 1 was cut along a line passing through the center of each of the via conductors or the electrode pads, and connections between the external terminal electrodes and the via conductors or the electrode pads were observed with SEM (scanning electron microscope). As a result, in the ceramic multilayer substrate of Example 1, a connection state, for example, shown in FIG. 5A or 5B was observed. It was thus discovered that even if a monolithic ceramic capacitor is slightly shifted from the location of a corresponding via conductor, the monolithic ceramic capacitor is connected to the via conductor without disconnection, as shown in FIG. 5B.

On the other hand, in Comparative Example 1, some of the monolithic ceramic capacitors were shifted from the locations of the corresponding electrode pads, thereby disconnecting the electrode pads from the monolithic ceramic capacitors.

Therefore, it was found that when an external terminal electrode is connected to a via conductor through a connection step, both can be securely connected to each other, thereby significantly improving connection reliability. In this example, when a ceramic green sheet was locally deformed on the order of several tens of μm by burying a monolithic ceramic capacitor, wiring with printed electrodes was easily cut because the thickness of the electrodes was several μm. However, the via conductors were not cut because the via conductors had a substantially cylindrical shape having a thickness equivalent to the sheet thickness.

Example 2

Figure 6:
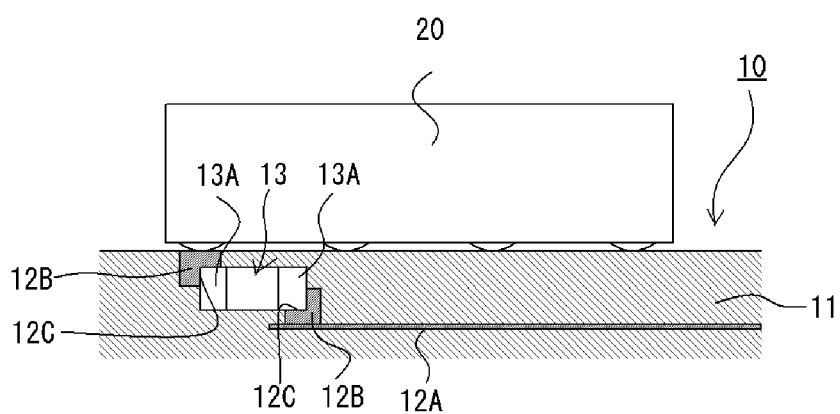
FIG. 6 is an enlarged sectional view showing a principal portion of a multilayer substrate with a built-in chip-type electronic component according to a further preferred embodiment of the present invention.

In this preferred embodiment, a ceramic multilayer substrate was formed in the same manner using the same materials as in Example 1. However, in this preferred embodiment, the built-in monolithic ceramic capacitor used had a sintered ceramic body (approximate size: 1.6 mm×0.8 mm×0.5 mm, internal electrode: Ni, capacity specification: 1 μF) and external terminal electrodes which were formed on both ends by applying a conductive paste including Ag as a main component, and then baking the paste. As shown in FIG. 6, an integrated circuit element (IC) was disposed as a surface-mounted component 20 on the upper surface of the ceramic multilayer substrate 10, and a monolithic ceramic capacitor 13 was disposed as a bypass capacitor immediately below the IC. One of external terminal electrodes 13A of the monolithic ceramic capacitor 13 was connected directly to a power supply of the IC through a via conductor 12B, and the other external terminal electrode 13A of the monolithic ceramic capacitor 13 was connected, through a via conductor 12B, to an in-plane conductor 12A formed as a ground layer in the ceramic multilayer substrate 10. The external terminal electrodes 13A of the monolithic ceramic capacitor 13 were connected to the respective via conductors 12B through connection steps 12C.

Since a bypass capacitor is typically inevitably disposed outside an IC on a substrate, connection to the bypass capacitor on the substrate is achieved by extending wiring from the inside of the substrate. In this example, the IC is connected directly to the monolithic ceramic capacitor 13 defining a bypass capacitor through the via conductors 12B, and thus, the impedance between both can be decreased. In addition, the external terminal electrodes 13A of the monolithic ceramic capacitor 13 are connected to the respective via conductors 12B through the connections steps 12C, thereby improving the connection reliability.

Example 3

In this example, the amount of the sintering aid added to a low temperature co-fired ceramic material to be added to a constraining layer was changed to alter the adhesive force of the constraining layer to a laminate of ceramic green sheets. A ceramic multilayer substrate was formed in the same manner as in Example 1, except that the amount of shrinkage in a planar direction of the laminate was controlled as shown in Table 1.

Next, the occurrence of cracks in the ceramic multilayer substrate and the monolithic ceramic capacitors was observed by X-ray crack detection. As a result, as shown in Table 1, when an amount of shrinkage of the ceramic laminate increased to the minus side beyond −5%, cracks were detected in the built-in monolithic ceramic capacitor, while when an amount of shrinkage of the ceramic laminate increased to the plus side beyond +5%, cracks were detected in both the built-in monolithic ceramic capacitors and the ceramic laminate.

TABLE 1

| Conte of sintering aid (% by weight) | Amount of shrinkage (%) | Influence on component and substrate | Number of cracked components in 200 mm substrate (/400 components) |
|---|---|---|---|
| 1.7 | −5.1 | Cracks in component | 241 |
| 1.6 | −5.0 | No problem | 0 |
| 1.4 | −4.0 | No problem | 0 |
| 1.2 | −2.0 | No problem | 0 |
| 1.0 | −1.0 | No problem | 0 |
| 0.5 | 0 | No problem | 0 |
| 0.3 | +1.0 | No problem | 0 |
| 0.2 | +3.0 | No problem | 0 |

TABLE 1-continued

| Conte of sintering aid (% by weight) | Amount of shrinkage (%) | Influence on component and substrate | Number of cracked components in 200 mm substrate (/400 components) |
|---|---|---|---|
| 0.1 | +5.0 | No problem | 0 |
| 0.0 | +5.1 | Cracks in substrate and component | 165 |

The results shown in Table 1 indicate that when an amount of shrinkage of the ceramic layers exceeds ±5%, cracks occur in the monolithic ceramic capacitors and/or the ceramic laminate even if the monolithic ceramic capacitors are connected to the via conductors without disconnection. It is thus found that the amount of the sintering aid added to a constraining layer is preferably about 0.1% by weight to about 1.6% by weight which maintains the shrinkage in a range of about ±5%.

The present invention can be preferably applied to a ceramic multilayer substrate and a method for manufacturing the same used for electronic devices.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing a multilayer substrate including a built-in chip-type electronic component comprising the steps of:

disposing a chip-type electronic component including a terminal electrode on a dielectric layer including a via conductor such that the terminal electrode is connected to the via conductor, the terminal electrode being provided on a principal surface of the chip-type electronic component and on an end surface of the chip-type electronic component perpendicular or substantially perpendicular to the principal surface of the chip-type electronic component, and the via conductor being in direct contact with portions of the terminal electrode on both of the principal surface and the end surface of the chip-type electronic component; and laminating the dielectric layer including the chip-type electronic component disposed thereon and another dielectric layer to form a laminate including the built-in chip-type electronic component.

2. The method for manufacturing the multilayer substrate including the built-in chip-type electronic component according to claim 1, wherein each of the dielectric layers includes a ceramic green body, the chip-type electronic component includes a ceramic sintered body used as an element body, and the ceramic green body including the chip-type electronic component disposed thereon and the other ceramic green body are laminated to form a ceramic green laminate including the built-in chip-type electronic component, followed by firing of the ceramic green laminate.

3. The method for manufacturing the multilayer substrate including the built-in chip-type electronic component according to claim 2, wherein the other ceramic green body includes a via conductor to be connected to the terminal electrode of the chip-type electronic component.

4. The method for manufacturing the multilayer substrate with the built-in chip-type electronic component according to claim 2, further comprising the steps of:

forming the ceramic green bodies using a low-temperature co-fired ceramic material; and forming a conductor pattern composed of silver or copper as a main component in the ceramic green laminate.

5. The method for manufacturing the multilayer substrate including the built-in chip-type electronic component according to claim 2, further comprising the step of adding a shrinkage suppression layer composed of a powder, which is not substantially sintered at the sintering temperature of the ceramic green bodies, in the ceramic green laminate or on a surface thereof.

* * * * *